(12) United States Patent
Song et al.

(10) Patent No.: US 9,748,417 B2
(45) Date of Patent: Aug. 29, 2017

(54) COMPOSITION FOR FORMING SOLAR CELL ELECTRODE AND ELECTRODE PRODUCED FROM SAME

(71) Applicant: CHEIL INDUSTRIES, INC., Gumi-si, Gyeongsangbuk-do (KR)

(72) Inventors: Dae Seop Song, Uiwang-si (KR); Jae Ho Kim, Uiwang-si (KR); Young Ki Park, Uiwang-si (KR); Sang Hyun Yang, Uiwang-si (KR); Young Wook Choi, Uiwang-si (KR)

(73) Assignee: Cheil Industries, Inc., Gumi-Si, Gyeongsangbuk-do (KR)

( * ) Notice: Subject to any disclaimer, the term of this patent is extended or adjusted under 35 U.S.C. 154(b) by 64 days.

(21) Appl. No.: 14/441,220

(22) PCT Filed: Sep. 12, 2013

(86) PCT No.: PCT/KR2013/008272
§ 371 (c)(1),
(2) Date: May 7, 2015

(87) PCT Pub. No.: WO2014/098351
PCT Pub. Date: Jun. 26, 2014

(65) Prior Publication Data
US 2015/0303325 A1  Oct. 22, 2015

(30) Foreign Application Priority Data

Dec. 21, 2012  (KR) .................. 10-2012-0151435

(51) Int. Cl.
*H01L 31/0224* (2006.01)
*H01B 1/08* (2006.01)
(Continued)

(52) U.S. Cl.
CPC ...... *H01L 31/022425* (2013.01); *C03C 3/062* (2013.01); *C03C 3/122* (2013.01);
(Continued)

(58) Field of Classification Search
CPC ....... H01L 31/022425; H01L 31/02167; H01L 31/0272; H01L 31/0224; H01B 1/22; H01B 1/16; H01B 1/08; H01B 1/12
(Continued)

(56) References Cited

U.S. PATENT DOCUMENTS

2007/0215202 A1* 9/2007 Salami ................ C03C 3/062
136/256
2011/0232746 A1 9/2011 Carroll et al.
(Continued)

FOREIGN PATENT DOCUMENTS

CN 102097269 A 6/2011
CN 102104076 A 6/2011
(Continued)

OTHER PUBLICATIONS

Chinese Office action and Search Report dated Feb. 4, 2016 for corresponding Chinese Patent Application No. 201380056107.1.; Song, et al.
(Continued)

*Primary Examiner* — Tri V Nguyen
(74) *Attorney, Agent, or Firm* — Lee & Morse, P.C.

(57) ABSTRACT

A composition for solar cell electrodes and electrodes fabricated using the same. The composition includes a silver (Ag) powder; a first glass frit containing PbO and a second glass frit containing $V_2O_5$ and $TeO_2$; and an organic vehicle. The composition includes two types of glass frits on PbO and $V_2O_5$-$TeO_2$, respectively, thereby minimizing contact resistance and adverse influence on a p-n junction of silicon solar cells.

7 Claims, 1 Drawing Sheet

(51) Int. Cl.
  *H01B 1/12*   (2006.01)
  *H01B 1/22*   (2006.01)
  *C03C 3/062*  (2006.01)
  *C03C 3/12*   (2006.01)
  *C03C 8/02*   (2006.01)
  *C03C 8/12*   (2006.01)
  *C03C 8/16*   (2006.01)
  *C03C 8/18*   (2006.01)
  *C03C 8/20*   (2006.01)
  *C03C 8/22*   (2006.01)

(52) U.S. Cl.
  CPC .................. *C03C 8/02* (2013.01); *C03C 8/12* (2013.01); *C03C 8/16* (2013.01); *C03C 8/18* (2013.01); *C03C 8/20* (2013.01); *C03C 8/22* (2013.01); *H01B 1/22* (2013.01); *Y02E 10/50* (2013.01)

(58) Field of Classification Search
  USPC ........... 252/500–520.4, 521.3; 136/252–256; 438/57; 257/746
  See application file for complete search history.

(56) References Cited

U.S. PATENT DOCUMENTS

| | | | |
|---|---|---|---|
| 2012/0211076 A1* | 8/2012 | Okaniwa | H01L 31/022425 136/256 |
| 2013/0228207 A1* | 9/2013 | Wang | H01L 31/022425 136/244 |
| 2013/0269773 A1* | 10/2013 | Wang | H01L 31/0264 136/256 |
| 2014/0038346 A1* | 2/2014 | Hang | H01L 31/022425 438/98 |
| 2015/0072463 A1* | 3/2015 | Yang | H01L 31/022425 438/72 |

FOREIGN PATENT DOCUMENTS

| | | |
|---|---|---|
| CN | 102194537 A | 9/2011 |
| CN | 102403047 A | 4/2012 |
| CN | 102543254 A | 7/2012 |
| KR | 10-2011-0066431 A | 6/2011 |
| KR | 10-2011-0069593 A | 6/2011 |
| KR | 10-2011-0105682 A | 9/2011 |
| KR | 10-2012-0028789 A | 3/2012 |
| KR | 10-2012-0065037 A | 6/2012 |
| TW | I322332 B | 3/2010 |
| TW | 201125138 A | 7/2011 |
| WO | WO 9408911 A1 | 4/1994 |
| WO | WO 2011/140189 A1 | 11/2011 |
| WO | WO 2011/140197 A1 | 11/2011 |
| WO | WO 2012/129554 A2 | 9/2012 |

OTHER PUBLICATIONS

Korean Office Action for 10-2012-0151435 dated Mar. 9, 2015; Song, et al.
Office Action mailed May 20, 2015 in corresponding Taiwanese Patent Application No. 102144397.

* cited by examiner

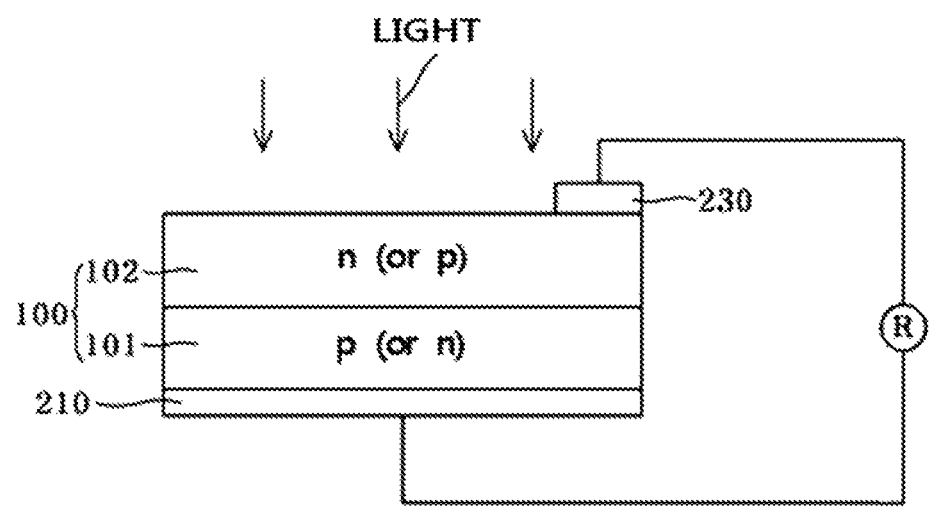

COMPOSITION FOR FORMING SOLAR CELL ELECTRODE AND ELECTRODE PRODUCED FROM SAME

TECHNICAL FIELD

The present invention relates to a composition for solar cell electrodes and electrodes fabricated using the same.

BACKGROUND ART

Solar cells generate electricity using the photovoltaic effect of a pn junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

Further, with increasing use of wafers having various surface resistances, a temperature range for baking is widened and thus there is an increasing need for electrode pastes capable of securing thermal stability in a wide sintering temperature range.

The inventors of the present invention developed a composition for solar cell electrodes capable of securing p-n junction stability while improving solar cell efficiency by minimizing adverse influence on the p-n junction given varying surface resistances.

DISCLOSURE

Technical Problem

One object of the present invention is to provide a composition for solar cell electrodes which can minimize both contact resistance and serial resistance.

Another object of the present invention is to provide a composition for solar cell electrodes which exhibit excellent conversion efficiency.

Further object of the present invention is to provide solar cell electrodes which fabricated using the composition for solar cell electrodes.

The aforementioned and other objects of the present invention will be achieved by the present invention as described below.

Technical Solution

In accordance with one aspect of the invention, a composition for solar cell electrodes may include silver (Ag) powder; a first glass frit containing PbO and a second glass frit containing $V_2O_5$ and $TeO_2$; and an organic vehicle.

The composition may include 60 wt % to 95 wt % of the silver (Ag) powder; 0.1 wt % to 20 wt % of the first and second glass frits; and 1 wt % to 30 wt % of the organic vehicle.

A weight ratio of the second glass frit to the first glass frit ranges from 1:2 to 1:3.

The first glass frit may include PbO in amount of 50 wt % to 90 wt %.

The second glass frit may include $V_2O_5$ and $TeO_2$ in a weight ratio of $V_2O_5$ to $TeO_2$ ranging from 1:2 to 1:3.

The first and second glass frits may have an average particle diameter D50 of 0.1 μm to 10 μm.

The composition may further include at least one selected from the group of dispersants, thixotropic agents, plasticizers, viscosity stabilizers, anti-foaming agents, pigments, UV stabilizers, antioxidants, and coupling agents.

In accordance with another aspect of the invention, a solar cell electrode formed of the composition for solar cell electrodes.

Advantageous Effects

A composition for solar cell electrodes of the present invention includes two types of glass frits on PbO and $V_2O_5$-$TeO_2$, thereby minimizing contact resistance and adverse influence on a p-n junction of silicon solar cells.

DESCRIPTION OF DRAWINGS

FIG. 1 is a schematic view of a solar cell in accordance with one embodiment of the present invention.

BEST MODE

Composition for Solar Cell Electrodes

A composition for solar cell electrodes according to the present invention includes silver (Ag) powder (A); glass frits (B) including a first glass frit containing PbO and a second glass frit containing $V_2O_5$ and $TeO_2$; and an organic vehicle (C). Now, present invention will be described in more detail.

(A) Silver Powder

The composition for solar cell electrodes according to the invention includes silver (Ag) powder as a conductive powder. The particle size of the silver powder may be on a nanometer or micrometer scale. For example, the silver powder may have a particle size of dozens to several hundred nanometers, or several to dozens of micrometers. Alternatively, the silver powder may be a mixture of two or more types of silver powders having different particle sizes.

The silver powder may have a spherical, flake or amorphous shape.

The silver powder preferably has an average particle diameter (D50) of 0.1 μm to 3 μm, more preferably 0.5 μm to 2 μm. The average particle diameter may be measured using, for example, a Model 1064D (CILAS Co., Ltd.) after dispersing the conductive powder in isopropyl alcohol (IPA) at 25° C. for 3 minutes via ultrasonication. Within this range of average particle diameter, the composition may provide low contact resistance and low line resistance.

The silver powder may be present in an amount of 60 wt % to 95 wt % based on the total weight of the composition. Within this range, the conductive powder can prevent deterioration in conversion efficiency due to increase in resistance and difficulty forming the paste due to relative reduction in amount of the organic vehicle. Advantageously, the silver powder may be present in an amount of 70 wt % to 90 wt %.

(B) Glass Frit

The glass frit serves to enhance adhesion between the conductive powder and the wafer or the substrate and to form silver crystal grains in an emitter region by etching an anti-reflection layer and melting the silver powder so as to reduce contact resistance during the baking process of the composition for electrodes. Further, during the baking process, the glass frit softens and decreases the baking temperature.

When the area of the solar cell is increased in order to improve solar cell efficiency, there can be a problem of increase in solar cell contact resistance. Thus, it is necessary to minimize both serial resistance and influence on the p-n junction. In addition, as the baking temperatures varies within a broad range with increasing use of various wafers having different sheet resistances, it is desirable that the glass frit secure sufficient thermal stability to withstand a wide range of baking temperatures.

According to the present invention, the glass frit includes a first glass frit containing PbO and a second glass frit containing $V_2O_5$ and $TeO_2$. A PbO-based glass frit, which is the first glass frit, essentially includes PbO. And a PbO-based glass frit further includes a metal oxide selected from the group of silicon oxide, bismuth oxide, zinc oxide, boron oxide, lithium oxide, magnesium oxide, aluminum oxide, tungsten oxide, and combinations thereof, but except for PbO.

The first glass frit may include 50 wt % to 90 wt % of PbO. Within this range, glass frit can be more easily prepared and the composition including such glass frit can have improved adhesion.

A $V_2O_5$—$TeO_2$-based glass frit, which is the second glass frit, essentially includes vanadium oxide ($V_2O_5$) and tellurium oxide ($TeO_2$), which are metal oxides. The second glass frit may further include at least one metal oxide selected from the group of silicon oxide, bismuth oxide, zinc oxide, boron oxide, lithium oxide, magnesium oxide, aluminum oxide, tungsten oxide, and combinations thereof.

In the second glass frit, a weight ratio of vanadium oxide ($V_2O_5$) to tellurium oxide ($TeO_2$) may range from 1:2 to 1:3. Within this range, glass frit can be more easily prepared and it is possible to prevent detachment of electrodes after forming the electrodes using the composition including the thereof.

The first and second glass frits may be prepared by any typical method known in the art. For example, the aforementioned metal oxides may be mixed using a ball mill or a planetary mill. Then, the mixture is melted at 900° C. to 1300° C., followed by quenching to 25° C. The obtained resultant is subjected to pulverization using a disk mill, a planetary mill, or the like, thereby preparing a glass frit.

The first and second glass frits may have an average particle diameter D50 of 0.1 μm to 10 μm, and may have a spherical or amorphous shape.

The first and second glass frits may be present in amount of 0.5 wt % to 20 wt % based on the total weight of the composition. Further, a weight ratio of the second glass frit to the first glass frit may range from 1:1.2 to 1:3, preferably from 1:2 to 1:3. Within this range, the composition can have improved adhesion and can prevent detachment of electrodes.

(C) Organic Vehicle

The organic vehicle imparts suitable viscosity and rheological characteristics for printing to the composition for solar cell electrodes through mechanical mixing with the inorganic component of the composition.

The organic vehicle may be any typical organic vehicle used in solar cell electrode compositions, and may include a binder resin, a solvent, and the like.

The binder resin may use acrylate resins or cellulose resins, and the like. Ethyl cellulose is generally used as the binder resin. In addition, the binder resin may use ethyl hydroxyethyl cellulose, nitrocellulose, blends of ethyl cellulose and phenol resins, alkyd resins, phenol resins, acrylate ester resins, xylene resins, polybutene resins, polyester resins, urea resins, melamine resins, vinyl acetate resins resins, wood rosin, polymethacrylates of alcohols, and the like.

The solvent may use of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone or ethyl lactate etc, and it may used alone or as mixtures thereof.

The organic vehicle may be present in an amount of about 1 wt % to about 30 wt % based on the total weight of the composition. Within this range, the organic vehicle can provide sufficient adhesive strength and excellent printability.

(D) Additives

The composition may further include typical additives to enhance flow and process properties and stability, as needed. The additives may include dispersants, thixotropic agents, plasticizers, viscosity stabilizers, anti-foaming agents, pigments, UV stabilizers, antioxidants, coupling agents, and the like. These additives may be used alone or as mixtures thereof. These additives may be present in an amount of about 0.1 wt % to about 5 wt %, based on the total weight of the composition for solar cell electrode, but the amount can be changed as needed.

Solar Cell Electrode and Solar Cell Including the Same

Other aspects of the invention relate to an electrode formed of the composition for solar cell electrodes and a solar cell including the same. FIG. 1 shows a solar cell in accordance with one embodiment of the invention.

Referring to FIG. 1, a rear electrode 210 and a front electrode 230 may be formed by printing and baking the composition on a wafer or substrate 100 that includes a p layer (or n layer) 101 and an n-layer (or p layer) 102 as an emitter. For example, a preliminary process of preparing the rear electrode is performed by printing the composition on the rear surface of the wafer and drying the printed composition for electrodes at about 200° C. to about 400° C. for about 10 seconds to about 60 seconds. Further, a preliminary process for preparing the front electrode may be performed by printing the composition for electrodes on the front surface of the wafer and drying the printed composition for electrodes. Then, the front electrode and the rear electrode may be formed by baking the wafer at 400° C. to 950° C., preferably at 850° C. to 950° C., for 30 to 50 seconds.

The prepared solar cell electrodes may have serial resistance Rs of 0.01 mΩ or less and conversion efficiency of 15% or more.

EXAMPLES

Next, the present invention will be described in more detail with reference to examples. However, it should be noted that these examples are provided for illustration only and should not be construed in any way as limiting the invention.

Details of components used in the following examples and comparative examples were as follows.

(A) Silver powder: AG-4-8 (Dowa Hightech Co., Ltd.).

(B) Glass frit: Glass frit according to the composition listed in Table 1.

(C) Organic vehicle: Ethylcellulose (STD4, Dow chemical company) dissolved in butyl carbitol at 60° C.

(D) Additives: Dispersant (BYK102, BYK-Chemie) and thixotropic agent (Thixatrol ST, Elementis Co.).

TABLE 1

|  |  | PbO | $V_2O_5$ | $TeO_2$ | ZnO | $Li_2O_3$ | MgO | $ZrO_2$ | $SiO_2$ | $WO_3$ |
|---|---|---|---|---|---|---|---|---|---|---|
| First glass frit | (B1) | 86.2 | — | — | 4.1 | 2.3 | 1 | 1.4 | 5 | — |
| Second glass frit | (B21) | — | 20 | 60 | — | — | — | — | — | 20 |
|  | (B22) | — | 30 | 50 | — | — | — | — | — | 20 |
|  | (B23) | — | 30 | 60 | — | — | — | — | — | 10 |
| Third glass frit | (B3) | 40 | 50 | — | 10 | — | — | — | — | — |

(unit: wt %)

Examples 1 to 3 and Comparative Examples 1 to 7

Example 1

As an organic binder, 0.95 wt % of ethylcellulose (STD4, Dow Chemical Company) was sufficiently dissolved in 8.55 wt % of butyl carbitol at 60° C., and 87 wt % of spherical silver powder (AG-4-8, Dowa Hightech Co., Ltd.) having an average particle diameter of 2.0 μm; 2 wt % of a first glass frit B1 and 1 wt % of a second glass frit B21 according to the compositions as listed in TABLE 1; 0.2 wt % of a dispersant BYK102 (BYK-Chemie); and 0.3 wt % of a thixotropic agent Thixatrol ST (Elementis Co., Ltd.) were added to the binder solution, followed by mixing and kneading in a 3-roll kneader, thereby preparing a composition for solar cell electrodes.

Example 2

A composition for solar cell electrodes was prepared in the same manner as in Example 1 except that the composition included 2 wt % of the first glass frit B1 and 1 wt % of the second glass frit B22 together with other components in amounts as listed in TABLE 2.

Example 3

A composition for solar cell electrodes was prepared in the same manner as in Example 1 except that the composition included 2 wt % of the first glass frit B1 and 1 wt % of the second glass frit B23 together with other components in amounts as listed in TABLE 2.

Comparative Example 1

A composition for solar cell electrodes was prepared in the same manner as in Example 1 except that the composition included the first glass frit B1 alone in TABLE 1 as a glass frit, together with other components in amounts as listed in TABLE 2.

Comparative Example 2

A composition for solar cell electrodes was prepared in the same manner as in Example 1 except that the composition included the second glass frit B21 alone in TABLE 1 as a glass frit, together with other components in amounts as listed in TABLE 2.

Comparative Example 3

A composition for solar cell electrodes was prepared in the same manner as in Example 1 except that the composition included the second glass frit B22 alone in TABLE 1 as a glass frit, together with other components in amounts as listed in TABLE 2.

Comparative Example 4

A composition for solar cell electrodes was prepared in the same manner as in Example 1 except that the composition included the second glass frit B23 alone in TABLE 1 as a glass frit, together with other components in amounts as listed in TABLE 2.

Comparative Example 5

A composition for solar cell electrodes was prepared in the same manner as in Example 1 except that the respective components were used in amounts as listed in TABLE 2.

Comparative Example 6

A composition for solar cell electrodes was prepared in the same manner as in Example 1 except that the composition included the second glass frit B3 alone in TABLE 1 as a glass frit, together with other components in amounts as listed in TABLE 2.

Comparative Example 7

A composition for solar cell electrodes was prepared in the same manner as in Example 1 except that the respective components were used in amounts as listed in TABLE 2.

Evaluation of Properties

The compositions prepared in the examples and comparative examples were printed onto a front surface of a crystalline mono-wafer by screen-printing in a predetermined pattern, followed by drying in an IR drying furnace. Cells formed according to above procedure were subjected to baking at 600° C. to 900° C. for 60 seconds to 210 seconds in a belt-type baking furnace. And then manufactured cells according to this procedure evaluated as to conversion efficiency (%) and serial resistance (Rs) using a solar cell efficiency tester CT-801 (Pasan Co., Ltd.), and contact resistance using Correscan Potential. The measured conversion efficiency, serial resistance, and contact resistance are shown in TABLE 2.

TABLE 2

|  | examples 1 | examples 2 | examples 3 | Comparative examples 1 | Comparative examples 2 | Comparative examples 3 | Comparative examples 4 | Comparative examples 5 | Comparative examples 6 | Comparative examples 7 |
|---|---|---|---|---|---|---|---|---|---|---|
| Silver (Ag) powder | 87 | 87 | 87 | 87 | 87 | 87 | 87 | 87 | 87 | 87 |
| First glass frit (B1) | 2 | 2 | 2 | 3 | — | — | — | 2.5 | — | 1.7 |
| Second glass frit (B2) B21 | 1 | — | — | — | 3 | — | — | 0.5 | — | 1.3 |
| B22 | — | 1 | — | — | — | 3 | — | — | — | — |
| B23 | — | — | 1 | — | — | — | 3 | — | — | — |
| Third glass frit (B3) | — | — | — | — | — | — | — | — | 3 | — |
| Organic vehicle Binder | 0.95 | 0.95 | 0.95 | 0.95 | 0.95 | 0.95 | 0.95 | 0.95 | 0.95 | 0.95 |
| Solvent | 8.55 | 8.55 | 8.55 | 8.55 | 8.55 | 8.55 | 8.55 | 8.55 | 8.55 | 8.55 |
| Additives | 0.5 | 0.5 | 0.5 | 0.5 | 0.5 | 0.5 | 0.5 | 0.5 | 0.5 | 0.5 |
| Efficiency (%) | 16.82 | 16.24 | 16.87 | 2.52 | 7.96 | 8.92 | 11.28 | 5.32 | 1.2 | 15.87 |
| Serial Resistance (Rs)(mΩ) | 0.0068 | 0.0059 | 0.0054 | 0.162 | 0.0588 | 0.00476 | 0.0263 | 0.113 | 0.65 | 0.0084 |
| Correscan Potential | 16.08 | 14.03 | 12.11 | 218.23 | 63.25 | 54.53 | 44.24 | 120.3 | 350.6 | 21.60 |

(unit: wt %)

As shown in Table 2, it was ascertained that the solar cell electrodes fabricated using the compositions prepared in Examples 1 to 3 had low serial resistance and Correscan potential, thereby providing excellent conversion efficiency, as compared with those of Comparative Examples 1 to 4 and 6 in which just one type of glass frit was used, Comparative Example 5 in which the first glass frit was used in an excessive amount, and Comparative Example 7 in which the second glass frit was used in an excessive amount.

It should be understood that various modifications, changes, alterations, and equivalent embodiments can be made by those skilled in the art without departing from the spirit and scope of the invention.

The invention claimed is:

1. A composition for solar cell electrodes, comprising:
   (A) silver (Ag) powder;
   (B) a glass frit including a first glass fit b-1 containing PbO and a second glass frit b-2 containing $V_2O_5$ and $TeO_2$; and
   (C) an organic vehicle, wherein:
   the second glass frit comprises vanadium oxide ($V_2O_5$) and tellurium oxide ($TeO_2$) in a weight ratio of vanadium oxide ($V_2O_5$) to tellurium oxide ($TeO_2$) ranging from 1:2 to 1:3, and
   a weight ratio of the second glass frit to the first glass frit ranges from 1:2 to 1:3.

2. The composition according to claim 1, comprising: 60 wt % to 95 wt % of (A) the silver (Ag) powder; 0.1 wt % to 20 wt % of (B) the glass frit; and 1 wt % to 30 wt % of (C) the organic vehicle.

3. The composition according to claim 1, wherein the first glass frit comprises 50 wt % to 90 wt % of PbO.

4. The composition according to claim 1, wherein the first and second glass frits have an average particle diameter D50 of 0.1 μm to 10 μm.

5. The composition according to claim 1, further comprising: at least one selected from the group of dispersants, thixotropic agents, plasticizers, viscosity stabilizers, antifoaming agents, pigments, UV stabilizers, antioxidants, and coupling agents.

6. A solar cell electrode prepared from the composition for solar cell electrodes according to claim 1.

7. The composition according to claim 1, wherein the second glass frit further comprises tungsten oxide ($WO_3$).

* * * * *